(12) United States Patent
Yoo et al.

(10) Patent No.: US 11,139,421 B2
(45) Date of Patent: Oct. 5, 2021

(54) THERMOELECTRIC DEVICE AND THERMOELECTRIC MODULE

(71) Applicant: LG INNOTEK CO., LTD., Seoul (KR)

(72) Inventors: Young Sam Yoo, Seoul (KR); Woo Chul Kim, Seoul (KR); Hyung Eui Lee, Seoul (KR); Jong Hyun Kim, Seoul (KR); Hwan Joo Park, Seoul (KR); Yoo Min Eom, Seoul (KR); Jun Phil Hwang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 97 days.

(21) Appl. No.: 16/329,687

(22) PCT Filed: Aug. 28, 2017

(86) PCT No.: PCT/KR2017/009350
§ 371 (c)(1),
(2) Date: Feb. 28, 2019

(87) PCT Pub. No.: WO2018/044006
PCT Pub. Date: Mar. 8, 2018

(65) Prior Publication Data
US 2019/0198741 A1 Jun. 27, 2019

(30) Foreign Application Priority Data
Sep. 2, 2016 (KR) .................. 10-2016-0113491

(51) Int. Cl.
*H01L 35/10* (2006.01)
*H01L 35/16* (2006.01)
(Continued)

(52) U.S. Cl.
CPC .............. *H01L 35/10* (2013.01); *H01L 35/02* (2013.01); *H01L 35/16* (2013.01); *H01L 35/18* (2013.01); *H01L 35/32* (2013.01)

(58) Field of Classification Search
CPC ................................ H01L 35/10; H01L 35/32
See application file for complete search history.

(56) References Cited

U.S. PATENT DOCUMENTS

2008/0000511 A1* 1/2008 Kuroyanagi ............ H01L 35/32
136/201
2014/0326287 A1* 11/2014 Wiant ..................... H01L 35/32
136/205
(Continued)

FOREIGN PATENT DOCUMENTS

JP 2015-88577 A 5/2015
KR 10-2010-0050090 A 5/2010
(Continued)

OTHER PUBLICATIONS

English machine translation of Kyung et al. (KR-20150039135-A) provided by the EPO website, All Pages. (Year: 2020).*
(Continued)

*Primary Examiner* — Daniel P Malley, Jr.
(74) *Attorney, Agent, or Firm* — Saliwanchik, Lloyd & Eisenschenk (57) ABSTRACT

A thermoelectric device is disclosed. The thermoelectric device comprises: a body part comprising a hollow in which a semiconductor device is disposed; a plurality of connecting parts protruding on the lateral sides of the body part and comprising connecting holes; and a plurality of electrode parts connected to the semiconductor device and extending to the connecting holes of the connecting parts.

6 Claims, 10 Drawing Sheets

(51) Int. Cl.
 *H01L 35/32* (2006.01)
 *H01L 35/18* (2006.01)
 *H01L 35/02* (2006.01)

(56) References Cited

U.S. PATENT DOCUMENTS

2015/0013740 A1\* 1/2015 Kaibe .................... H01L 35/30
                                                            136/212
2018/0056835 A1\* 3/2018 Konrad ................ H01L 35/325

FOREIGN PATENT DOCUMENTS

| KR | 10-2015-0039135 A |   | 4/2015  |
|----|-------------------|---|---------|
| KR | 20150039135 A     | \* | 4/2015  |
| KR | 10-2015-0132085 A |   | 11/2015 |
| KR | 10-2016-0046645 A |   | 4/2016  |

OTHER PUBLICATIONS

International Search Report dated Nov. 28, 2017 in International Application No. PCT/KR2017/009350.

\* cited by examiner

THERMOELECTRIC DEVICE AND THERMOELECTRIC MODULE

CROSS-REFERENCE TO RELATED APPLICATIONS

This application is the U.S. national stage application of International Patent Application No. PCT/KR2017/009350, filed Aug. 28, 2017, which claims the benefit under 35 U.S.C. § 119 of Korean Application No. 10-2016-0113491, filed Sep. 2, 2016; which are hereby incorporated by reference in their entirety.

TECHNICAL FIELD

Embodiments of the present invention relate to a thermoelectric device and a thermoelectric module, and more particularly, to a thermoelectric device and a thermoelectric module that can achieve high integration and have a large area.

BACKGROUND ART

A thermoelectric effect is a phenomenon caused by movement of electrons and holes inside a material, which means direct energy conversion between heat and electricity.

Thermoelectric devices are collectively referred to as devices utilizing thermoelectric effect and have a structure in which a P-type thermoelectric material and an N-type thermoelectric material are bonded between metal electrodes to form a PN junction pair.

Thermoelectric devices may be classified into a device using a temperature change of electrical resistance, a device using a Seebeck effect, which is a phenomenon in which electromotive force is generated due to a temperature difference, a device using a Peltier effect, which is a phenomenon in which heat is absorbed or generated by current, and the like.

The thermoelectric devices are widely applied to household appliances, electronic parts, communication parts, and the like. For example, the thermoelectric devices may be applied to a cooling device, a heating device, a power generation device, and the like. Accordingly, a demand for thermoelectric performance of the thermoelectric devices is gradually increasing.

In addition, various types of devices using thermoelectric devices are being developed and applied to various fields so that a demand for flexible devices is increasing.

However, flexible thermoelectric devices are being mainly developed using microelectromechanical systems (MEMS) processes based on thin films, but it is difficult to implement large-area devices. Accordingly, many failures are occurring in mass production and product application.

In addition, there is a limit in that thermoelectric performance is very small because a leg of a thermoelectric material is very thin.

DISCLOSURE

Technical Problem

Embodiments of the present invention are directed to providing a flexible thermoelectric module.

Further, embodiments of the present invention are directed to providing a thermoelectric device and a thermoelectric module having high durability by connecting adjacent thermoelectric devices through a connecting member.

Further, embodiments of the present invention are directed to providing a thermoelectric device and a thermoelectric module having a high degree of integration and high performance.

It should be noted that objects of the present invention are not limited to the above-described objects, and other objects of the present invention will be apparent to those skilled in the art from the following descriptions.

Technical Solution

One aspect of the present invention provides a thermoelectric device which includes a body part including a hollow in which a semiconductor device is disposed, a plurality of connecting parts configured to protrude on side surfaces of the body part and including connecting holes, and a plurality of electrode parts connected to the semiconductor device and configured to extend to the connecting holes of the connecting parts.

The plurality of connecting parts may include a first connecting part disposed on one side surface of the body part, a second connecting part disposed on a surface, which is perpendicular to the one side surface in a clockwise direction, with respect to a central axis of the hollow, a third connecting part disposed on a surface, which is perpendicular to the second connecting part in a clockwise direction, with respect to the central axis of the hollow, and a fourth connecting part disposed on a surface, which is perpendicular to the third connecting part in a clockwise direction, with respect to the central axis of the hollow.

The first connecting part and the third connecting part may be disposed to alternate with each other on opposite surfaces.

The second connecting part and the fourth connecting part may be disposed to alternate with each other on opposite surfaces.

The first connecting part and the third connecting part may be disposed at the same distance in a direction of the central axis and the second connecting part, and the fourth connecting part may be disposed at the same distance in a direction of the central axis.

The first connecting part and the third connecting part may be disposed to alternate with the second connecting part and the fourth connecting part in the direction of the central axis.

The electrode parts may include a first electrode disposed on an upper surface of the body part and a second electrode disposed on a lower surface of the body part.

The first electrode and the second electrode may extend to the connecting holes of the connecting parts disposed on opposite surfaces.

The electrode parts may be connected to the semiconductor device through through-holes formed in the body part.

Another aspect of the present invention provides a thermoelectric module which includes a plurality of thermoelectric devices arranged in a matrix and a plurality of connecting members arranged in a matrix between the plurality of thermoelectric devices adjacent to each other so as to connect the plurality of adjacent thermoelectric devices, wherein each of the thermoelectric devices includes a body part including a hollow in which a semiconductor device is disposed, a plurality of connecting parts configured to protrude on side surfaces of the body part and including connecting holes, and a plurality of electrode parts connected to the semiconductor device and configured to extend to the connecting holes of the connecting parts, and the connecting members are disposed to pass through the connecting holes.

The electrode parts may include a first electrode disposed on an upper surface of the body part and a second electrode disposed on a lower surface of the body part.

The first electrode and the second electrode may extend to the connecting holes of the connecting parts disposed on opposite surfaces.

The electrode parts may be electrically connected to the electrode parts of the adjacent thermoelectric device in any one of row or column directions.

The connecting members may include a space configured to accommodate the extended electrode parts.

The connecting members may be movable through the connecting holes.

Advantageous Effects

According to embodiments, a flexible thermoelectric module can be implemented.

Further, adjacent thermoelectric devices can be connected through a connecting member to move left and right, and thus a thermoelectric device and a thermoelectric module with high durability against external force can be manufactured.

Further, a thermoelectric device and a thermoelectric module having a high degree of integration and high performance can be manufactured.

Further, a thermoelectric device that can achieve a large area can be manufactured.

Various and advantageous advantages and effects of the present invention are not limited to descriptions to be described below and can be more easily understood in descriptions of specific embodiments of the present invention.

MODES OF THE INVENTION

While the invention is susceptible to various modifications and alternative forms, specific embodiments thereof are shown by way of example in the drawings and will be described in detail herein. It should be understood, however, that there is no intent to limit the invention to the particular forms disclosed, but on the contrary, the invention is to cover all modifications, equivalents, and alternatives falling within the spirit and scope of the invention.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

The terminology used herein is for the purpose of describing particular embodiments only and is not intended to be limiting to the present invention. As used herein, the singular forms "a," "an," and "the" are intended to also include the plural forms, unless the context clearly indicates otherwise. It should be further understood that the terms "comprise," "comprising," "include," and/or "including," when used herein, specify the presence of stated features, integers, steps, operations, elements, parts, or combinations thereof, but do not preclude the presence or addition of one or more other features, integers, steps, operations, elements, parts, or combinations thereof.

Unless otherwise defined, all terms including technical and scientific terms used herein have the same meaning as commonly understood by one of ordinary skill in the art to which this invention belongs. It should be further understood that terms, such as those defined in commonly used dictionaries, should be interpreted as having a meaning that is consistent with their meaning in the context of the relevant art and are not to be interpreted in an idealized or overly formal sense unless expressly so defined herein.

Hereinafter, embodiments will be described in detail with reference to the accompanying drawings, the same or corresponding components are denoted by the same reference numerals regardless of reference numbers, and thus the description thereof will not be repeated.

Figure 1:
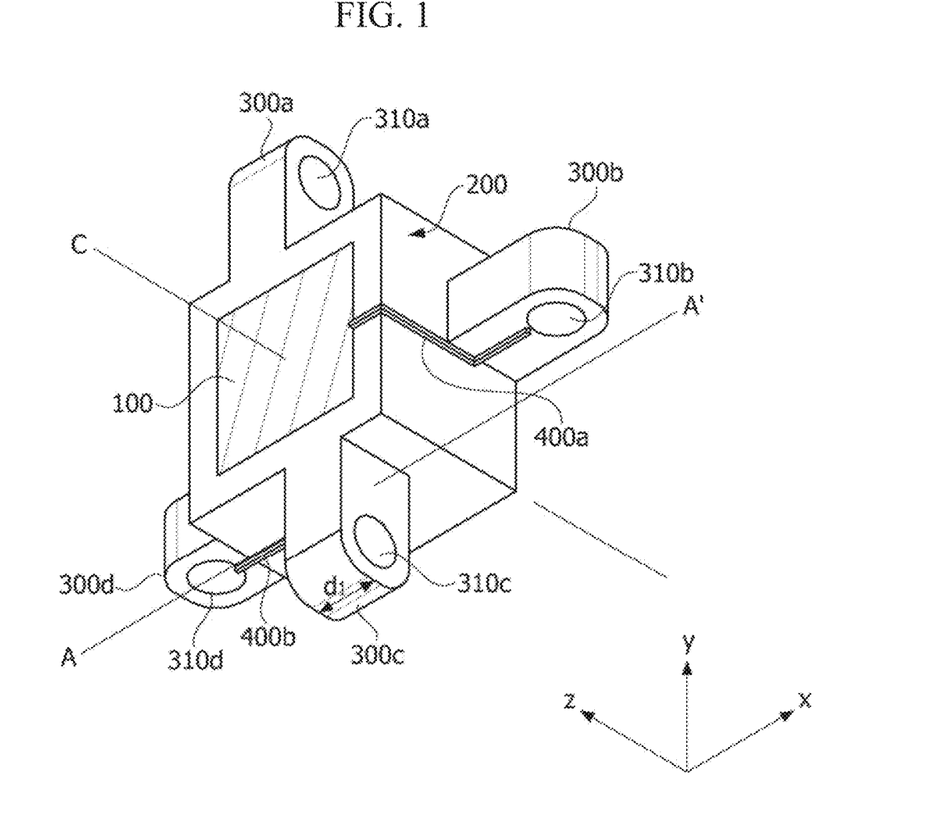
FIG. 1 is a perspective view of a thermoelectric device according to an embodiment of the present invention.
Figure 2:
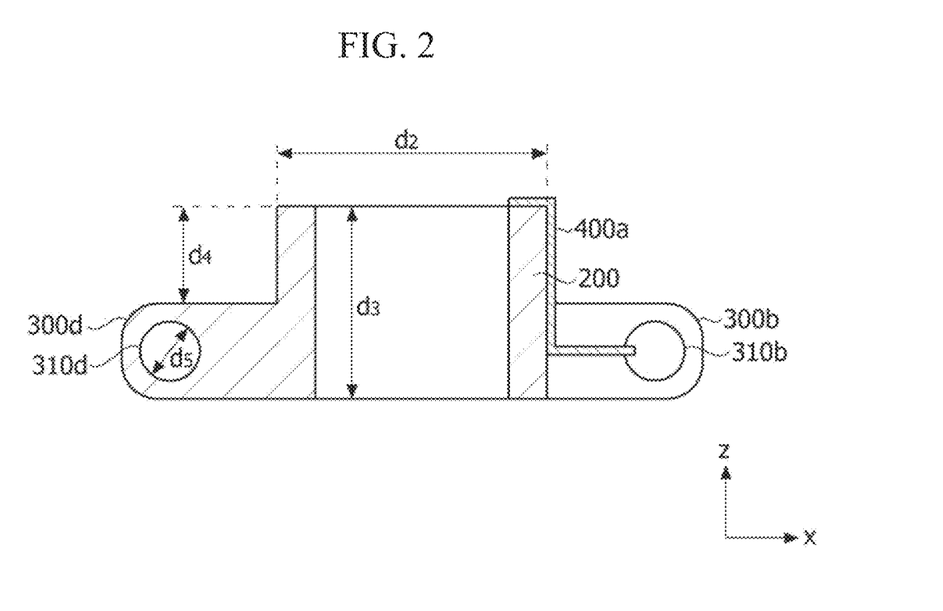
FIG. 2 is a side cross-sectional view of the thermoelectric device taken along line A-A' of FIG. 1.

FIG. 1 is a perspective view of a thermoelectric device according to an embodiment of the present invention and FIG. 2 is a side cross-sectional view of the thermoelectric device taken along line A-A' of FIG. 1.

Referring to FIGS. 1 and 2, the thermoelectric device according to the embodiment of the present invention includes a body part 200 including a hollow in which a semiconductor device 100 is disposed, a plurality of connecting parts 300 protruding on side surfaces of the body part 200 and including connecting holes 310a, 310b, 310c, and 310d, and electrode parts 400 connected to the semiconductor device 100 and extending to the connecting holes 310a, 310b, 310c, and 310d of the connecting parts 300.

First, the body part 200 includes the hollow. The semiconductor device 100 may be disposed in the hollow. The semiconductor device 100 may include a P-type thermoelectric leg or an N-type thermoelectric leg. Here, the P-type thermoelectric leg and the N-type thermoelectric leg may be bismuth telluride (Bi—Te) based thermoelectric legs containing bismuth (Bi) and tellurium (Ti) as main source materials. The P-type thermoelectric leg may be a thermoelectric leg including 99 to 99.999 wt % of bismuth telluride (Bi—Te) based main source material containing at least one of antimony (Sb), nickel (Ni), aluminum (Al), copper (Cu), silver (Ag), lead (Pb), boron (B), gallium (Ga), tellurium (Te), bismuth (Bi), and indium (In) and 0.001 to 1 wt % of a mixture containing Bi or Te with respect to 100 wt % of total weight. For example, the P-type thermoelectric leg may include Bi—Se—Te as a main source material and may further include Bi or Te in an amount of 0.001 to 1 wt % with respect to the total weight. The N-type thermoelectric leg may be a thermoelectric leg including 99 to 99.999 wt % of bismuth telluride (Bi—Te) based main source material containing at least one of selenium (Se), nickel (Ni), aluminum (Al), copper (Cu), silver (Ag), lead (Pb), boron (B), gallium (Ga), tellurium (Te), bismuth (Bi), and indium (In) and 0.001 to 1 wt % of mixture containing Bi or Te with respect to 100 wt % of total weight. For example, the N-type thermoelectric leg may include Bi—Sb—Te as a main source material and may further include Bi or Te in an amount of 0.001 to 1 wt % with respect to the total weight.

The P-type thermoelectric leg and the N-type thermoelectric leg may be formed in a bulk or stacked form. Generally, a bulk-type P-type thermoelectric leg or a bulk-type N-type thermoelectric leg may be obtained by a process in which an ingot is manufactured by performing heat-treatment on a thermoelectric material, thermoelectric leg powder is obtained by pulverizing and straining the ingot, the thermoelectric leg powder is sintered, and then a sintered body is cut. A stacked P-type thermoelectric leg or a stacked N-type thermoelectric leg may be obtained by a process in which a paste containing a thermoelectric material is applied on a sheet-shaped substrate to form a unit member, and then the unit member is stacked and cut.

In this case, the P-type thermoelectric leg may have the same shape and volume as the adjacent N-type thermoelectric leg or may have a different shape and volume from the adjacent N-type thermoelectric leg. For example, since the P-type thermoelectric leg and the N-type thermoelectric leg have different electric conduction characteristics from each other, a height or a cross-sectional area of the N-type thermoelectric leg may be different from a height or a cross-sectional area of the P-type thermoelectric leg.

When the P-type thermoelectric leg and the adjacent N-type thermoelectric leg are connected, thermoelectric performance may be expressed by a Seebeck index. The Seebeck index (ZT) may be expressed by Equation 1.

$$ZT = \alpha^2 \cdot \sigma \cdot T/k \quad \text{[Equation 1]}$$

Here, α denotes a Seebeck coefficient [V/K], σ denotes electrical conductivity [S/m], and $\alpha^2\sigma$ denotes a power factor [W/mK$^2$]). In addition, T denotes a temperature and k denotes thermal conductivity [W/mK]. k may be expressed by a·cp·ρ, a denotes thermal diffusivity [cm$^2$/S], cp denotes specific heat [J/gK], and ρ denotes a density [g/cm$^3$].

In order to obtain the Seebeck index, a Z value (V/K) may be measured using a Z meter, and the Seebeck index (ZT) may be calculated using the measured Z value.

The semiconductor device 100 may be disposed in the hollow of the body part 200 so as to fully fill the hollow of the body part 200. However, the present invention is not limited thereto, and the semiconductor device 100 may be disposed in the hollow of the body part 200 such that a space is formed in the hollow of the body part 200.

The body part 200 may be a hexahedron. However, the present invention is not limited thereto. Further, the hollow may also have various shapes such as a triangular shape, a rectangular shape, and a circular shape. Further, the connecting parts 300 may extend from the body part 200 and may be integrally formed with the body part 200. In addition, the connecting parts 300 may have a shape which is coupled to the body part 200 by adhesion. The body part 200 may include a ceramic or the like. However, the present invention is not limited thereto.

The plurality of connecting parts 300 are disposed to protrude on the side surfaces of the body part 200. The connecting parts 300 may be disposed to protrude on the side surfaces of the body part 200 except for an upper surface and a lower surface of the body part 200 in which holes of the hollow are formed. For example, the connecting parts 300 may protrude in the same number as the number of the side surfaces of the body part 200.

For example, the connecting parts 300 may include a first connecting part 300a, a second connecting part 300b, a third connecting part 300c, and a fourth connecting part 300d.

Specifically, the first connecting part 300a may be disposed on one side surface of the body part 200. Further, the second connecting part 300b may be disposed on a surface, which is perpendicular to the first connecting part 300a in a clockwise direction, with respect to a central axis C, which is an axis in a z-axis direction with respect to the hollow of the body part 200. Here, the z-axis direction may be a through direction of the hollow formed in the body part 200. The third connecting part 300c may be disposed on a surface, which is perpendicular to the second connecting part 300b in a clockwise direction, with respect to the central axis C of the hollow. The fourth connecting part 300d may be disposed on a surface, which is perpendicular to the third connecting part 300c in a clockwise direction, with respect to the central axis C of the hollow.

Further, the first connecting part 300a and the third connecting part 300c may be disposed to protrude on opposite surfaces, and the second connecting part 300b and the fourth connecting part 300d may be disposed to protrude on opposite surfaces.

Further, the first connecting part 300a and the third connecting part 300c may be located at the same height in the z-axis direction. In the same manner, the second connecting part 300b and the fourth connecting part 300d may be located at the same height in the z-axis direction.

However, the first connecting part 300a and the third connecting part 300c may be disposed to alternate with the second connecting part 300b and the fourth connecting part 300d in the z-axis direction. For example, the first connecting part 300a and the third connecting part 300c may be disposed to protrude above the body part 200 in the z-axis direction, and the second connecting part 300b and the fourth connecting part 300d may be disposed to protrude below the body part 200 in the z-axis direction. However, the present invention is not limited to such a configuration, and the first connecting part 300a and the third connecting part 300c may be disposed below the body part 200 in the z-axis direction at a lower level than the second connecting part 300b and the fourth connecting part 300d.

Therefore, the adjacent connecting parts may be disposed at different positions in the z-axis direction. With such a configuration, in coupling the thermoelectric device to an adjacent thermoelectric device, more thermoelectric devices may be connected in the same area. That is, a degree of integration may be increased. Further, a connection distance between the thermoelectric devices may be shortened so that durability against external force may be improved.

The first connecting part 300a and the third connecting part 300c may be disposed at the same height in the z-axis direction and may be disposed to alternate with each other in an x-axis direction. Here, the x-axis direction may be a direction which is perpendicular to the z-axis direction and in which the second connecting part 300b and the fourth connecting part 300d protrude from the body part 200.

In the same manner, the second connecting part 300b and the fourth connecting part 300d may be disposed at the same height in the z-axis direction and may be disposed to alternate with each other in a y-axis direction. Here, the y-axis direction may be a direction which is perpendicular to the z-axis and x-axis directions and in which the first connecting part 300a and the third connecting part 300c protrude from the body part 200.

For example, when adjacent thermoelectric devices are coupled to each other, a first connecting part 300a of a first thermoelectric device may have a region overlapping with a third connecting part 300c of a second thermoelectric device adjacent to the first thermoelectric device in the x-axis direction.

Further, when the adjacent thermoelectric devices are coupled to each other, a second connecting part 300b of the first thermoelectric device may have a region overlapping with a fourth connecting part 300d of the second thermoelectric device adjacent to the first thermoelectric device in the y-axis direction.

With such a configuration, in coupling the thermoelectric device to the adjacent thermoelectric device, the overlapping region may be formed and thus more thermoelectric devices may be connected in the same area. That is, in the thermoelectric device according to the embodiment, a degree of integration may be increased. Further, a connection distance between the thermoelectric devices may be shortened so that durability against external force may be improved.

A length $d_1$ of each of the connecting parts 300 may range from 1.5 mm to 2.5 mm. In FIG. 1, the length $d_1$ of each of the connecting parts 300 may be a length of the third connecting part 300c in the x-axis direction. However, the present invention is not limited thereto, and the length $d_1$ of each of the connecting parts 300 may be a length of the first connecting part 300c in the x-axis direction or a length of each of the second connecting part 300b and the fourth connecting part 300d in the y-axis direction.

The plurality of connecting parts 300 disposed on the side surfaces of the body part 200 may include the connecting holes 310a, 310b, 310c, and 310d, respectively. The connecting holes 310a, 310b, 310c, and 310d may be formed to have the same size as connecting holes 310a, 310b, 310c, and 310d of an adjacent thermoelectric device for connection to the adjacent thermoelectric device. The electrode parts 400 may be connected to the semiconductor device 100. The electrode parts 400 may extend to the connecting holes 310a, 310b, 310c, and 310d of the connecting parts 300 at upper and lower portions of the body part 200.

Further, the plurality of electrode parts 400 may be provided. However, the electrode parts 400 may be connected to a semiconductor device 100 included in an adjacent thermoelectric device and may be connected in series, but the present invention is not limited to the connection configuration.

Further, the semiconductor devices 100 connected to two ends of the electrode part 400 may be semiconductor devices 100 having different polarities. For example, when an N-type thermoelectric leg is connected to one end of the electrode part 400, a P-type thermoelectric leg may be connected to the other end of the electrode part 400.

The electrode part 400 may include any one of gold, silver, copper, lithium, beryllium, aluminum, tungsten, graphite, pinchbeck, magnesium, iridium, and molybdenum or an alloy of two or more types thereof.

The electrode parts 400 may include a first electrode 400a disposed on an upper surface of the body part 200 in the z-axis direction and a second electrode 400b disposed on a lower surface of the body part 200 in the z-axis direction. The first electrode 400a and the second electrode 400b may extend to the connecting holes 310a, 310b, 310c, and 310d of the connecting parts 300, which are disposed on opposite surfaces of the body part 200.

For example, the first electrode 400a may extend to a first connecting hole 310a, which is a connecting groove of the first connecting part 300a. The second electrode 400b may extend to a third connecting hole 310c of the third connecting part 300c. Further, the first electrode 400a and the second electrode 400b may extend to a connecting groove of the second connecting part 300b and a connecting groove of the fourth connecting part 300d, respectively. As described above, the first electrode 400a and the second electrode 400b may extend to extending grooves of at least two connecting parts of the plurality of connecting parts. Further, the first electrode 400a and the second electrode 400b may extend in protruding directions of the connecting parts formed on opposite surfaces of the body part 200, respectively. Further, the first electrode 400a and the second electrode 400b may be connected to the electrode parts 400 of the thermoelectric devices which are adjacent in the extended direction, respectively. An N-type thermoelectric leg and a P-type thermoelectric leg may be connected in series by connecting the adjacent thermoelectric device to the electrode part 400 of the thermoelectric device. Through this connection, the thermoelectric device may have high thermoelectric performance.

Referring to FIG. 2, a length of the body part 200 in the x-axis direction may be defined as $d_2$, a length of the body part 200 in the z-axis direction may be defined as $d_3$, a length excluding a length of each of the connecting parts 300b and 300d in the z-axis direction may be defined as $d_4$, and a length of each of the connecting holes 310b and 310d may be defined as $d_5$. In this case, the length $d_3$ may be greater than the length $d_4$ or $d_5$. Further, the length $d_4$ may be ⅓ to ⅔ of the length $d_3$. Although not shown, the length of each of the connecting parts 300b and 300d in the z-axis direction may be the same as the length $d_3$ of the body part 200 in the z-axis direction. For example, the length $d_2$ of the body part may range from 6.25 mm to 8.75 mm. The length $d_3$ of the body part in the z-axis direction may range from 3.75 mm to 6.25 mm. The length of each of the second connecting part and the fourth connecting part in the z-axis direction disposed on the side surfaces of the body part may be ⅓ to ⅔ of the length $d_3$ of the body part 200 in the z-axis direction. Further, the length $d_4$ excluding the length of the second connecting part or the fourth connecting part may be ⅓ to ⅔ of the length $d_3$ of the body part in the z-axis direction. Therefore, the length $d_4$ excluding the length of the second connecting part or the fourth connecting part in the z-axis direction disposed on the side surfaces of the body part 200 may range from 1.25 mm to 4.16 mm. Further, the length $d_5$ of each of the connecting holes 310b and 310d may range from 1.2 mm to 1.8 mm.

Referring to FIGS. 3A-3D, which show side cross-sections of various thermoelectric devices, a first electrode 400a may be disposed on an upper surface of a body part 200. A second electrode 400b may be disposed on a lower surface of the body part 200.

Figure 3A:
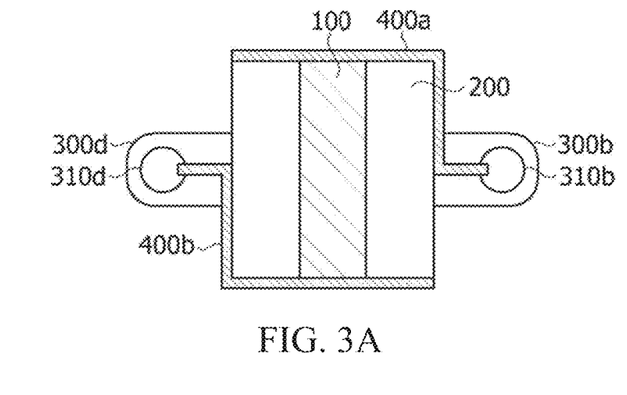
FIGS. 3A-3D show side cross-sections of various thermoelectric devices as examples.

In this case, as shown in FIG. 3A, a first electrode 400a and a second electrode 400b may be disposed on an entirety of an upper surface and a lower surface of a body part 200, respectively.

Figure 3B:
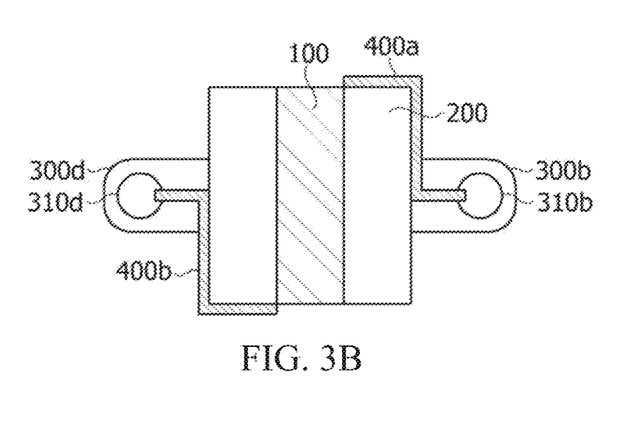

As another example, as shown in FIG. 3B, a first electrode 400a and a second electrode 400b may be disposed on portions of an upper surface and a lower surface of a body part 200, respectively, and may be electrically connected to a semiconductor device 100.

Figure 3C:
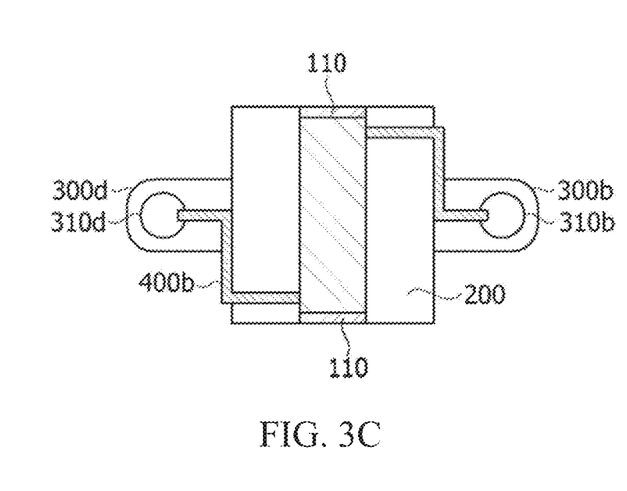

Further, as shown in FIG. 3C, a semiconductor device 100 may not fill a hollow of a body part 200. Therefore, although the semiconductor device 100 may be disposed in the hollow of the body part 200, a certain space may be present between an upper surface and a lower surface of the body part 200. A filler 110 may be disposed in the certain space formed due to such a configuration. With such a configuration in which the filler 110 is further disposed, thermoelectric performance of a thermoelectric device may be further improved.

Further, as shown in FIG. 3C, a plurality of through-holes may be formed in the body part 200, and a first electrode 400a and a second electrode 400b may be connected to the semiconductor device 100 through the through-holes. With such a configuration, the first electrode 400a and the second electrode 400b may be less influenced by external force so that durability may be enhanced.

Although not shown, the first electrode 400a and the second electrode 400b may be disposed on an entirety of inner surfaces of the plurality of connecting holes.

Figure 3D:
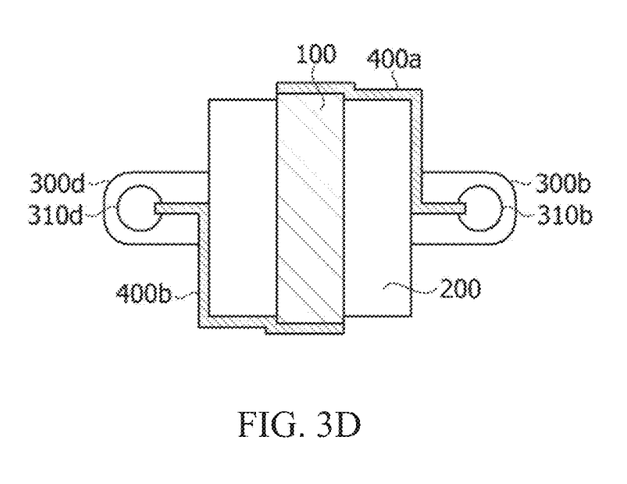

Further, as shown in FIG. 3D, a semiconductor device 100 disposed in a hollow of a body part 200 may protrude from any one of an upper surface and a lower surface of a body part 200. When the semiconductor device 100 protrudes from the upper surface and the lower surface of the body part 200, contact areas of a first electrode 400a and a second electrode 400b with the semiconductor device 100 may be increased so that electrical reliability may be improved.

Figure 4:
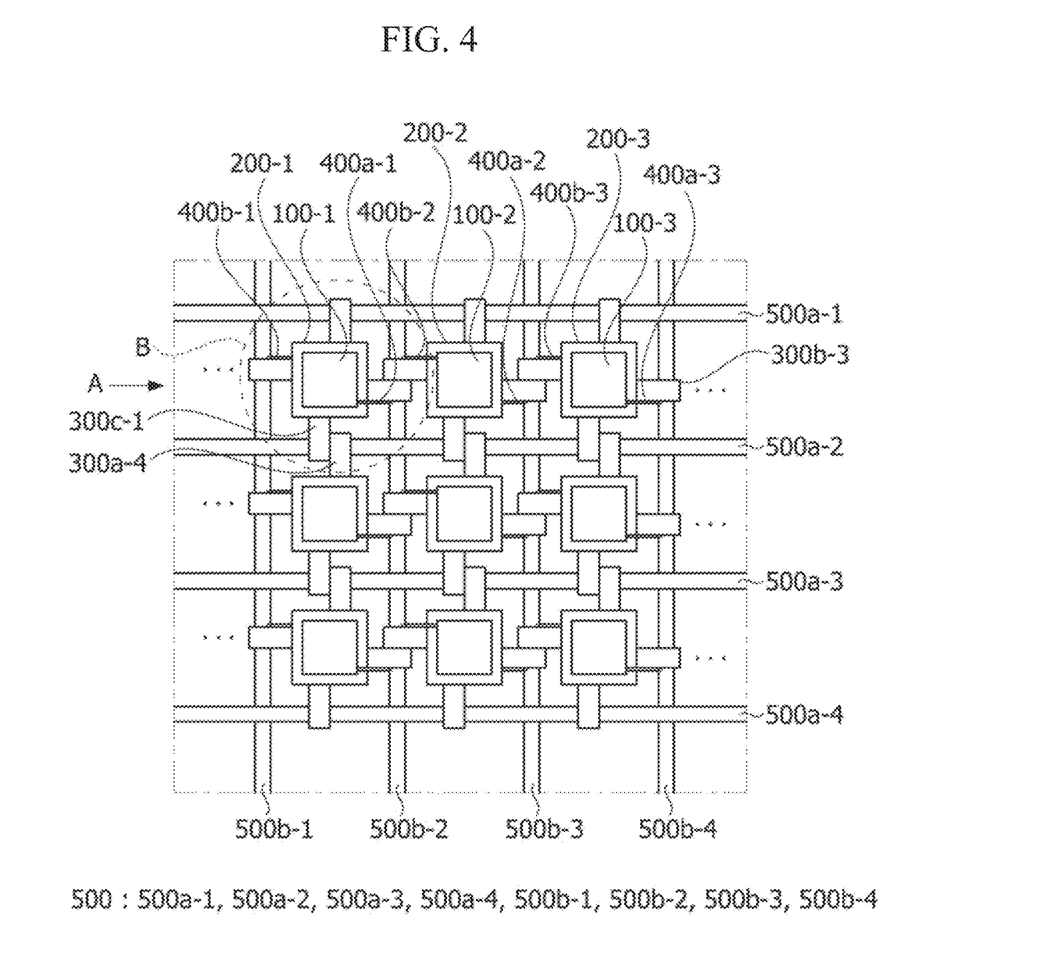
FIG. 4 is a top view of a thermoelectric module according to an embodiment of the present invention.
Figure 5:
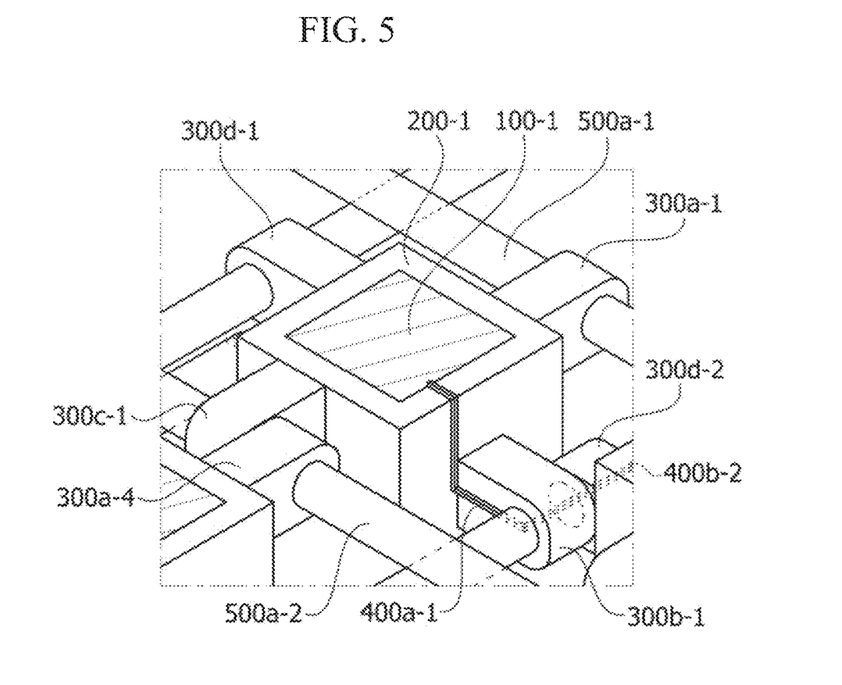
FIG. 5 is an enlarged view of a portion B of FIG. 4.

FIG. 4 is a top view of a thermoelectric module according to an embodiment of the present invention, and FIG. 5 is an enlarged view of a portion B of FIG. 4.

Referring to FIGS. 4 and 5, a plurality of thermoelectric devices may be arranged in a matrix. A plurality of connecting members 500 are arranged between a plurality of adjacent thermoelectric devices in a matrix so as to connect the plurality of adjacent thermoelectric devices. The plurality of connecting members 500 may be made of one selected from the polymer series so as to have high strength and flexibility. Specifically, the plurality of connecting members 500 may include any one of polycarbonate, nylon, polystyrene, polypropylene, polyethylene terephthalate (PET), urea formaldehyde (UF), acrylonitrile-butadiene-styrene (ABS), poly(methyl methacrylate) (PMMA), and unplasticized polyvinyl chloride (uPVC).

The plurality of connecting members 500 may include first connecting members 500a-1, 500a-2, 500a-3, 500a-4, and 500a-5, which are arranged in rows, and second connecting members 500b-1, 500b-2, 500b-3, 500b-4, and 500b-5, which are arranged in columns.

For example, a first connecting part 300a-1 of a first thermoelectric device may be coupled to a first connecting member 500a-1 in a first row through a first connecting hole of the first thermoelectric device. A second connecting part 300a-2 of the first thermoelectric device may be coupled to a second connecting member 500b-2 in a second row through a second connecting hole of the first thermoelectric device. Further, a third connecting part 300a-3 of the first thermoelectric device may be coupled to a first connecting member 500a-2 in the second row through a third connecting hole of the first thermoelectric device. A fourth connecting part 300a-4 of the first thermoelectric device may be coupled to a second connecting member 500b-1 in the first row through a fourth connecting hole of the first thermoelectric device.

The first thermoelectric device may be disposed adjacent to a plurality of thermoelectric devices. The first thermoelectric device may be electrically connected to the adjacent thermoelectric devices through electrode parts 400a-1 and 400b-1 to provide thermoelectric performance.

For example, the first thermoelectric device may be electrically connected to a second thermoelectric device disposed in a row direction. A first electrode 400a-1 of the first thermoelectric device may be connected to a semiconductor device 100-1 of the first thermoelectric device and may extend to a second connecting part 300b-1 of the first thermoelectric device along an upper surface of a body part 200-1 of the first thermoelectric device.

The extended first electrode 400a-1 of the first thermoelectric device may be accommodated inside the second connecting member 500b-2 disposed in a connecting hole of the second connecting part 300b-1 of the first thermoelectric device. The second connecting member 500b-2 may include an accommodating hole that can accommodate the first electrode 400a-1 of the first thermoelectric device. Therefore, the electrode parts of each thermoelectric device may be connected to the adjacent thermoelectric devices through the connecting members and may not be exposed to the outside so that the electrode parts are less influenced by external force.

Further, the first electrode 400a-1 of the first thermoelectric device may be connected to a semiconductor device 100-2 of the second thermoelectric device along upper surfaces of a fourth connecting part 300d-2 of the second thermoelectric device and a body part 200-2 of the second thermoelectric device. In this case, the semiconductor device 100-1 of the first thermoelectric device and the semiconductor device 100-2 of the second thermoelectric device may be thermoelectric legs having opposite polarities. For example, when the semiconductor device 100-1 of the first thermoelectric device is an N-type thermoelectric leg, the semiconductor device 100-2 of the second thermoelectric device may be a P-type thermoelectric leg. Further, a semiconductor device 100-3 of a third thermoelectric device connected to the semiconductor device 100-2 of the second thermoelectric device may be an N-type thermoelectric leg.

Further, the first electrode 400a-1 of the first thermoelectric device may be electrically connected to the adjacent thermoelectric devices in various directions. For example, the first electrode 400a-1 of the first thermoelectric device may extend not only in the row direction but also in the column direction.

The electrode parts of each thermoelectric device may extend to holes of connecting parts disposed on opposite surfaces. However, the present invention is not limited thereto, and the electrode parts may be connected to the semiconductor device of the adjacent thermoelectric device through the connecting members as necessary. In this case, the semiconductor devices of thermoelectric devices should be connected to each other in series, and the electrode parts may not be disposed such that an electrical short is generated so as to provide high thermoelectric performance through the plurality of thermoelectric devices.

The plurality of thermoelectric devices may be connected to the adjacent thermoelectric devices as described above. The thermoelectric device may be moved vertically and horizontally through four connecting parts and four connecting members arranged in a matrix. Further, the connecting members arranged in rows or columns may be disposed to alternate with the connecting members arranged in adjacent rows or columns. In this case, durability of the thermoelectric module, which is an example, may be improved. In addition, the plurality of connecting members arranged in rows may be disposed at the same height. Further, the plurality of connecting members arranged in columns may all be disposed at the same height.

Further, with the above-described configuration, the thermoelectric module according to the embodiment may have high durability, a large area, a high degree of integration, and high flexibility.

Figure 6:
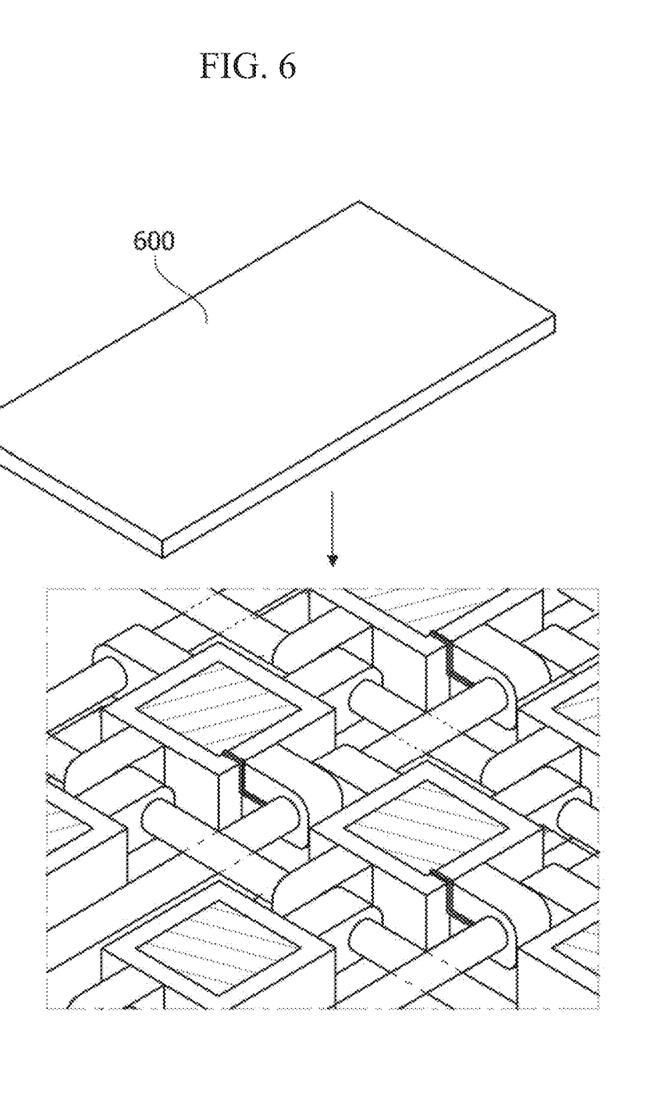
FIG. 6 is a view of a thermoelectric module to which a heat sink is coupled.

FIG. 6 is a view of a thermoelectric module to which a heat sink is coupled.

Referring to FIG. 6, a heat sink 600 may be disposed on an upper surface of the thermoelectric module described above. The heat sink 600 may perform a heat transfer function. The heat sink 600 may be made of a material having high heat conductivity and flexibility.

The heat sink 600 may be disposed on the upper surface or the lower surface of the thermoelectric module to absorb thermal energy transmitted from the semiconductor device 100 of the thermoelectric device and emit the thermal energy to the outside. Further, the heat sink 600 may block force applied to the thermoelectric module from the outside so that durability of the thermoelectric module may be improved.

Figure 7:
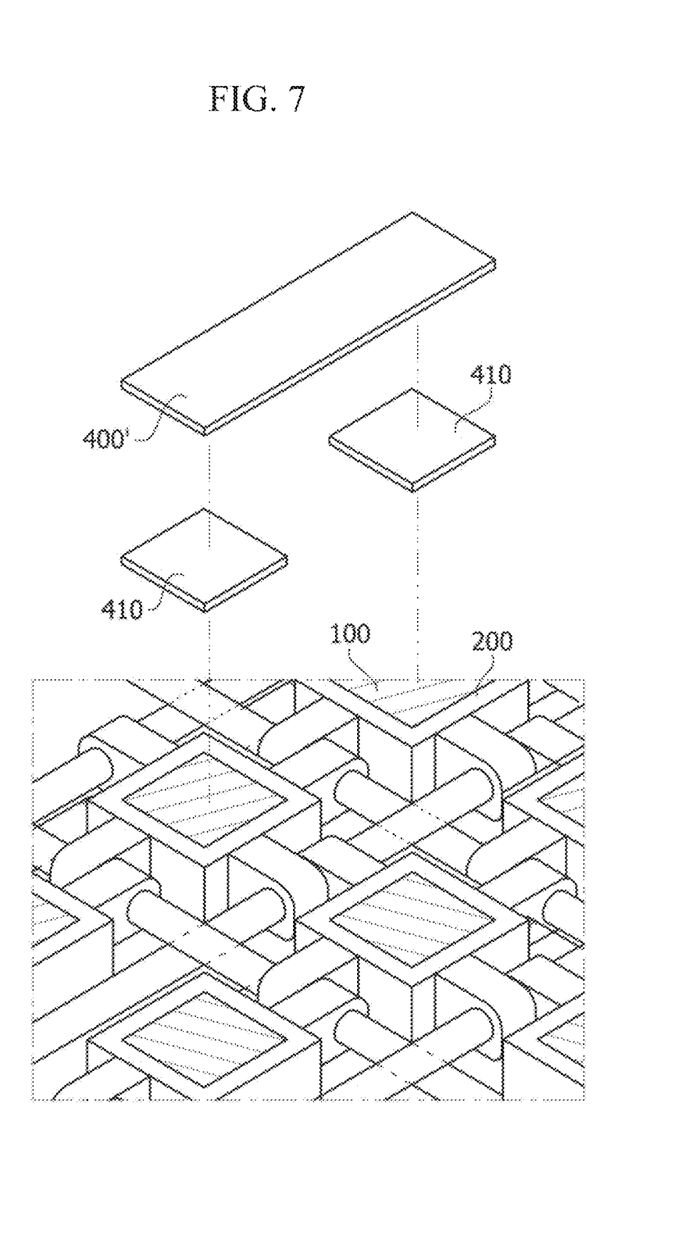
FIG. 7 is a perspective view of a thermoelectric module according to another embodiment.
Figure 8A:
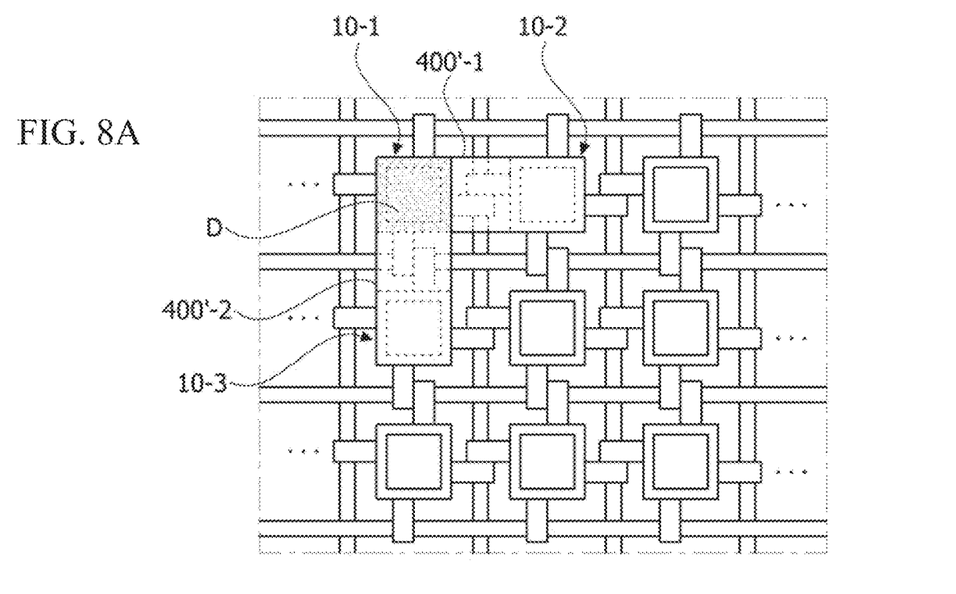
FIGS. 8A-8B show various electrode connection types of the thermoelectric module according to another embodiment.
Figure 8B:
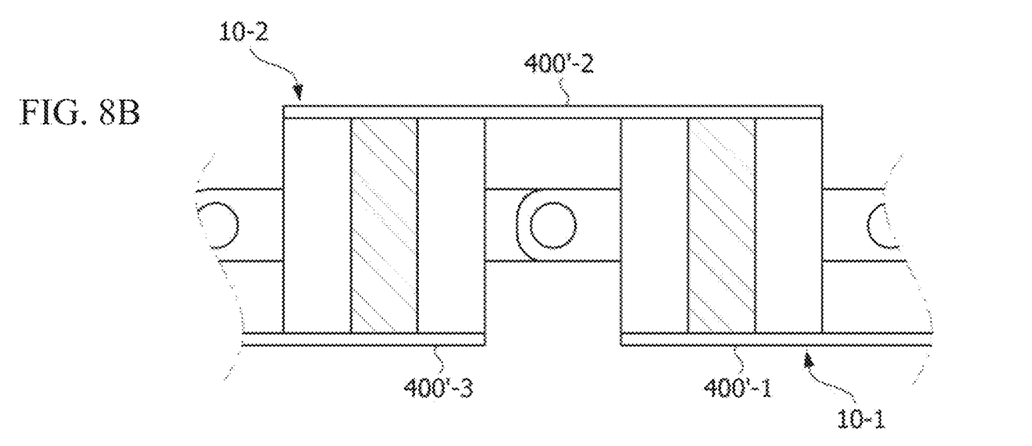

FIG. 7 is a perspective view of a thermoelectric module according to another embodiment, and FIGS. 8A-8B show various electrode connection types of the thermoelectric module according to another embodiment.

Referring to FIG. 7, in the thermoelectric module according to another embodiment, an electrode part 400' may be disposed on an upper surface or a lower surface of a body part 200 of an adjacent thermoelectric device.

The electrode part 400' may include a material which is electrically conductive and flexible, but the present invention is not limited thereto. The electrode part 400' may electrically connect two semiconductor devices so as to electrically connect two adjacent thermoelectric devices. For example, the electrode part 400' may be disposed on upper surfaces of a first thermoelectric device and a second thermoelectric device adjacent to the first thermoelectric device and may be electrically connected to upper surfaces of a semiconductor device of the first thermoelectric device and a semiconductor device of the second thermoelectric device.

The electrode parts 400' may be arranged in various manners such that thermoelectric devices of the thermoelectric module are connected in series.

Referring to FIG. 8A, the plurality of electrode parts may be provided. Further, the plurality of electrode parts may be disposed on any one of upper and lower surfaces of the plurality of thermoelectric device.

For example, a first electrode part 400'-1 may be disposed on an upper surface of a first thermoelectric device 10-1 and an upper surface of a second thermoelectric device 10-2 adjacent to the first thermoelectric device 10-1. Further, a second electrode part 400'-2 may be disposed on the upper surface of the first thermoelectric device 10-1 and an upper surface of a third thermoelectric device 10-3 adjacent to the first thermoelectric device 10-1. In this case, the first electrode part 400'-1 and the second electrode part 400'-2 may have an overlapping region D. The overlapping region D may be located on the semiconductor devices of the thermoelectric devices so that the semiconductor devices may be easily protected from the outside. The overlapping region D may have the same area as a total area of an upper surface of a body part of the first thermoelectric device 10-1, but the present invention is not limited to such a configuration.

With such a configuration, the plurality of thermoelectric devices included in the thermoelectric module may be electrically connected in series.

Further, as described above, the thermoelectric devices may be connected not only in series but also in various manners.

Referring to FIG. 8B, the plurality of electrode parts may be alternately disposed on the upper and lower surfaces of the plurality of thermoelectric devices. For example, the first electrode part 400'-1 may be disposed on the lower surface of the first thermoelectric device 10-1 and the second electrode part 400'-2 may be disposed on the upper surface of the first thermoelectric device 10-1. Further, the second electrode part 400'-2 may be disposed on an upper surface of the second thermoelectric device 10-2 adjacent to the first thermoelectric device 10-1, and a third electrode part 400'-3 may be disposed on a lower surface of the second thermoelectric device 10-2.

Accordingly, the plurality of electrode parts may all be disposed on the upper and lower surfaces of the thermoelectric module so that an entirety of the thermoelectric module may be protected from the outside.

Referring again to FIG. 7, the electrode part 400' may fully cover the upper surface or the lower surface of the semiconductor device. With such a configuration, the durability of the semiconductor device and the thermoelectric device may be improved.

However, the present invention is not limited to such a configuration, and the electrode part 400' may be disposed to partially cover the upper surface or the lower surface of the semiconductor device.

Further, an adhesive member 410 may be disposed between the electrode part 400' and the semiconductor device to connect the electrode part 400' to the semiconductor device. The adhesive member 410 may include a material having high electrical conductivity and thermal conductivity.

Figure 9:
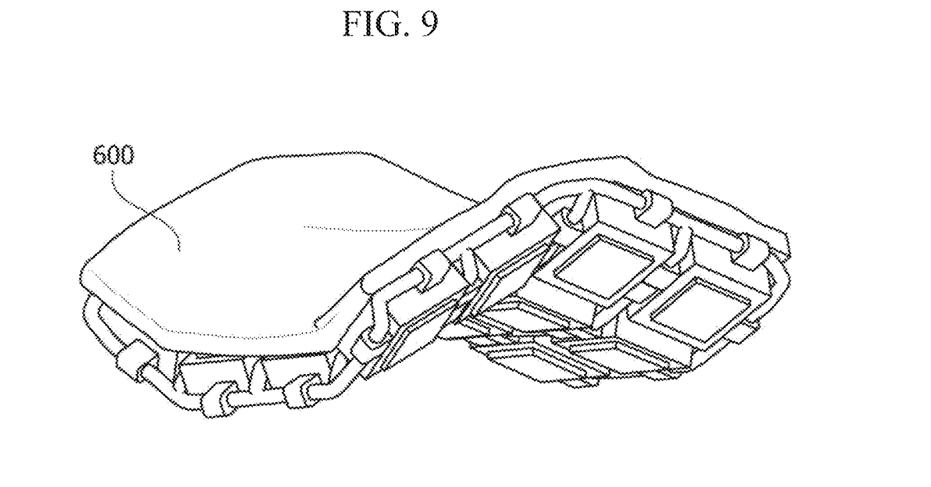
FIG. 9 is a view of a thermoelectric module according to still another embodiment to which a heat sink is coupled.

FIG. 9 is a view of a thermoelectric module according to still another embodiment to which a heat sink is coupled.

Referring to FIG. 9, a heat sink 600 may be disposed on an upper surface of the thermoelectric module according to still another embodiment. The heat sink 600 may perform a heat transfer function. The heat sink 600 may be made of a material having high heat conductivity and flexibility.

With such a configuration, the heat sink 600 may be directly connected to a semiconductor device of a thermoelectric device so that thermal energy generated from the semiconductor device may be emitted to the outside with high efficiency without heat loss.

Further, the thermoelectric module may be flexible and thus have various shapes due to upper and lower external force.

Figure 10:
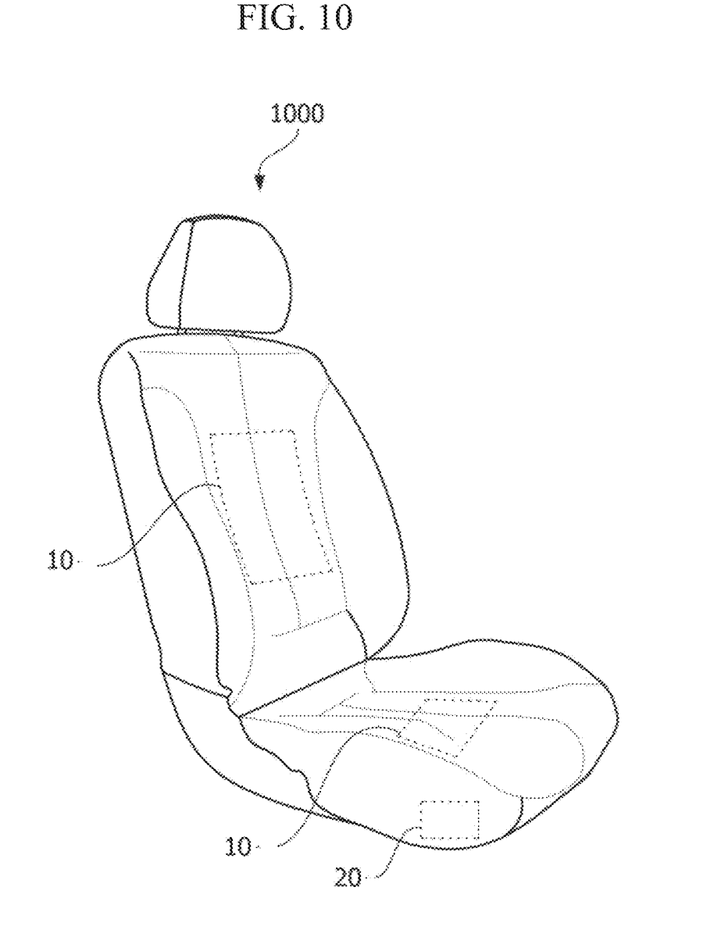
FIG. 10 is a schematic view showing an inner side of a seat to which the thermoelectric module of the present invention is applied.

FIG. 10 is a schematic diagram showing an inner side of a seat to which the thermoelectric module of the present invention is applied.

Referring to FIG. 10, the thermoelectric device and the thermoelectric module described above may be applied to cooling and heating devices. A thermoelectric module 10 may be installed in a cooling and heating device 1000 and may be electrically connected to a controller 20 installed in the cooling and heating device 1000. The thermoelectric module 10 may receive a signal for controlling cooling or heating from the controller 20.

Here, the cooling and heating device 1000 may be a seat, but the present invention is not limited thereto, and the cooling and heating device 1000 may be applied to any product requiring cooling or heating.

While the example embodiments of the present invention and their advantages have been described above in detail, it should be understood by those skilled in the art that various changes, substitutions and alterations may be made herein without departing from the scope of the invention as defined by the following claims.

The invention claimed is:

1. A thermoelectric device comprising:
    a body including a hollow in which a semiconductor device is disposed; wherein the semiconductor device includes a p-type or an n-type thermoelectric leg
    a plurality of connecting parts configured to protrude on side surfaces of the body and including connecting holes; and
    a plurality of electrode parts connected to the semiconductor device, wherein the plurality of electrode parts comprises: a first electrode disposed on a upper surface of the body; and a second electrode disposed on a lower surface of the body, wherein the first electrode is extended to the connecting hole of the second connecting part disposed on the second surface, and wherein the second electrode is extended to the connecting hole of the fourth connecting part disposed on the fourth surface
    wherein the side surfaces of the body include a first surface and a third surface opposite to each other, and a second surface and a fourth surface opposite to each other between the first surface and the third surface,
    wherein the plurality of connecting parts comprises:
        a first connecting part protruding from the first surface in a first direction;
        a third connecting part protruding on the third surface in a direction opposite to the first direction;
        a second connecting part protruding from the second surface in a second direction; and
        a fourth connecting part protruding on the fourth surface in a direction opposite to the second direction,
    wherein the first direction is perpendicular to the second direction, and
    wherein the first connecting part and the third connecting part are staggered in the first direction.

2. The thermoelectric device of claim 1, wherein the plurality of electrode parts is disposed to extend to the connecting holes of the connecting parts.

3. The thermoelectric device of claim 1,
    wherein the second surface is perpendicular to the first surface in a clockwise direction with respect to a central axis of the hollow,
    wherein the third surface is perpendicular to the second surface in the clockwise direction,
    wherein the fourth surface is perpendicular to the third surface in the clockwise direction, and
    wherein the first surface is perpendicular to the fourth surface in the clockwise direction.

4. The thermoelectric device of claim 1, wherein the second connecting part and the fourth connecting part are staggered in the second direction.

5. The thermoelectric device of claim 3, wherein:
    the first connecting part and the third connecting part have the same height in a direction of the central axis; and
    the second connecting part and the fourth connecting part have the same height in the direction of the central axis.

6. The thermoelectric device of claim 1, wherein the plurality of electrode parts is connected to the semiconductor device through through-holes formed in the body.

* * * * *